(12) United States Patent
Sun et al.

(10) Patent No.: US 7,572,033 B2
(45) Date of Patent: Aug. 11, 2009

(54) LIGHT SOURCE MODULE WITH HIGH HEAT-DISSIPATION EFFICIENCY

(75) Inventors: Chih-Hsien Sun, Miao-Li Hsien (TW); Cheng-Wei Chang, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 103 days.

(21) Appl. No.: 11/857,400

(22) Filed: Sep. 18, 2007

(65) Prior Publication Data
US 2008/0266885 A1    Oct. 30, 2008

(30) Foreign Application Priority Data
Apr. 27, 2007    (CN)    ......... 2007 1 0074236

(51) Int. Cl.
  *F21V 29/00*    (2006.01)
  *H05K 7/20*     (2006.01)
  *H01L 23/34*    (2006.01)
(52) U.S. Cl. ............. 362/294; 362/373; 361/707; 257/722
(58) Field of Classification Search ......... 362/294, 362/373, 218, 547, 800; 361/703, 704, 707, 361/709; 257/713, 722
See application file for complete search history.

(56) References Cited

U.S. PATENT DOCUMENTS

| 6,956,741 | B2* | 10/2005 | Su ..................... 361/704 |
| 7,098,486 | B2  | 8/2006  | Chen |
| 7,175,329 | B1  | 2/2007  | Chou |
| 7,241,030 | B2* | 7/2007  | Mok et al. ............. 362/294 |
| 7,434,964 | B1* | 10/2008 | Zheng et al. ........... 362/294 |
| 2003/0156416 | A1* | 8/2003 | Stopa et al. ........... 362/294 |
| 2006/0023448 | A1* | 2/2006 | Mok et al. ............. 362/231 |

FOREIGN PATENT DOCUMENTS

CN    2743698 Y    11/2005

* cited by examiner

*Primary Examiner*—Ali Alavi

(57) ABSTRACT

An exemplary light source module includes a printed circuit board (PCB), a heat-dissipating assembly, and a number of light emitting elements. The PCB includes a first surface, an opposite second surface, and a number of through holes. The heat-dissipating assembly is located adjacent to the second surface and includes a base, a number of heat-conducting elements, and a number of heat dissipation fins. The base includes a third surface defining a number of cavities therein and an opposite fourth surface. The heat dissipation fins extend from the fourth surface. Each of the heat-conducting elements is inlaid in a corresponding cavity. Each of the light emitting elements is placed in a corresponding through hole and thermally contacts a corresponding heat-conducting element. Each light emitting element electrically connects with the PCB and defines a respective light emitting surface located outside the corresponding through hole.

20 Claims, 3 Drawing Sheets

LIGHT SOURCE MODULE WITH HIGH HEAT-DISSIPATION EFFICIENCY

BACKGROUND

1. Technical Field

The present invention relates to light source modules and, particularly, to a light source module with a high heat-dissipation efficiency.

2. Description of Related Art

A light emitting diode (LED) is one type of semiconductor light source, and the electrical and optical characteristics and life span thereof are greatly temperature-dependent. Generally, a high working temperature will cause a deterioration of an internal quantum efficiency of the LED and shorten the life span thereof. Furthermore, a resistance of a semiconductor has a negative temperature coefficient and tends to be reduced with an increase in the working temperature. Such a reduced resistance will correspondingly result in a larger current at a given voltage and the generation of excessive heat. If the excessive heat cannot be effectively dissipated, a phenomenon of heat accumulation will be difficult to avoid, and, accordingly, the deterioration of the LED can be expected to be accelerated.

Referring to FIG. 3, a typical light source module 200 includes a printed circuit board 220, a heat-dissipating member 240, and a number of LEDs 260. The printed circuit board 220 defines two opposite surfaces (not labeled). The heat-dissipating member 240 and the LEDs 260 are respectively mounted on the two opposite surfaces of the printed circuit board 220. The heat-dissipating member 240 is thermally connected with the printed circuit board 220, with a thermal grease or paste interposed therebetween to promote heat conduction. The heat-dissipating member 240 usually defines a number of heat dissipation fins 242 on a surface thereof directed away from the printed circuit board 220. Such heat dissipation fins 242 are configured (i.e., structured and arranged) for facilitating the dissipation of heat from the light source module 200. The LEDs 260 are electrically connected with the printed circuit board 220.

However, the LEDs 260 are spaced from the heat-dissipating member 240 via the printed circuit board 220, which generally has a relatively low thermal conductivity (i.e., effectively acts more like a thermal insulator). Due to such spacing and the presence of the printed circuit board 220, heat generated from the LEDs 260 during operation would not be directly transmitted to the heat-dissipating member 240, thus not permitting effective heat dissipation. As such, the above-described phenomenon of heat accumulation will likely appear, and the deterioration of the light source module 200 would be accelerated as a result, even though the heat-dissipating member 240 is provided.

Therefore, what is needed is to provide a light source module with high heat-dissipation efficiency.

SUMMARY

A light source module, in accordance with a present embodiment, is provided. The light source module includes a printed circuit board, a heat-dissipating assembly, and a number of light emitting elements. The printed circuit board includes a first surface, a second surface opposite to the first surface, and a number of through holes penetrating/extending through the first surface and the second surface. The heat-dissipating assembly is located adjacent to the second surface of the printed circuit board and includes a base, a number of heat-conducting elements, and a number of heat dissipation fins. The base includes a third surface and a fourth surface opposite to the third surface. The third surface defines a number of cavities therein. The heat dissipation fins extend from the fourth surface and along a direction directed away from the third surface. Each of the heat-conducting elements is inlaid in a corresponding cavity defined in the third surface. Each of the light emitting elements is placed in a corresponding through hole of the printed circuit board and is placed in thermal contact with a corresponding heat-conducting element. The light emitting elements each are electrically connected with the printed circuit board, and each light emitting element defines a light emitting surface located outside the corresponding through hole and directed away from the second surface of the printed circuit board.

In one aspect, heat generated from the light emitting elements in operation can be directly transmitted to the heat-dissipating assembly due the existence of the through holes, which could effectively avoid the occurrence of the conventional phenomenon of heat accumulation. In another aspect, the heat-conducting elements each could achieve a larger heat extraction area with respect to a heat entry area thereof, resulting from the heat-conducting elements being inlaid in the cavities defined in the base and thereby making a relatively higher heat dissipation efficiency achievable.

Other advantages and novel features will become more apparent from the following detailed description of the present embodiments, when taken in conjunction with the accompanying drawings.

BRIEF DESCRIPTION OF THE DRAWINGS

Many aspects of the present light source module can be better understood with reference to the following drawings. The components in the drawings are not necessarily drawn to scale, the emphasis instead being placed upon clearly illustrating the principles of the present light source module. Moreover, in the drawings, like reference numerals designate corresponding parts throughout the several views.

The exemplifications set out herein illustrate at least one preferred embodiment, in one form, and such exemplifications are not to be construed as limiting the scope of the present light source module in any manner.

DETAILED DESCRIPTION

Figure 1:
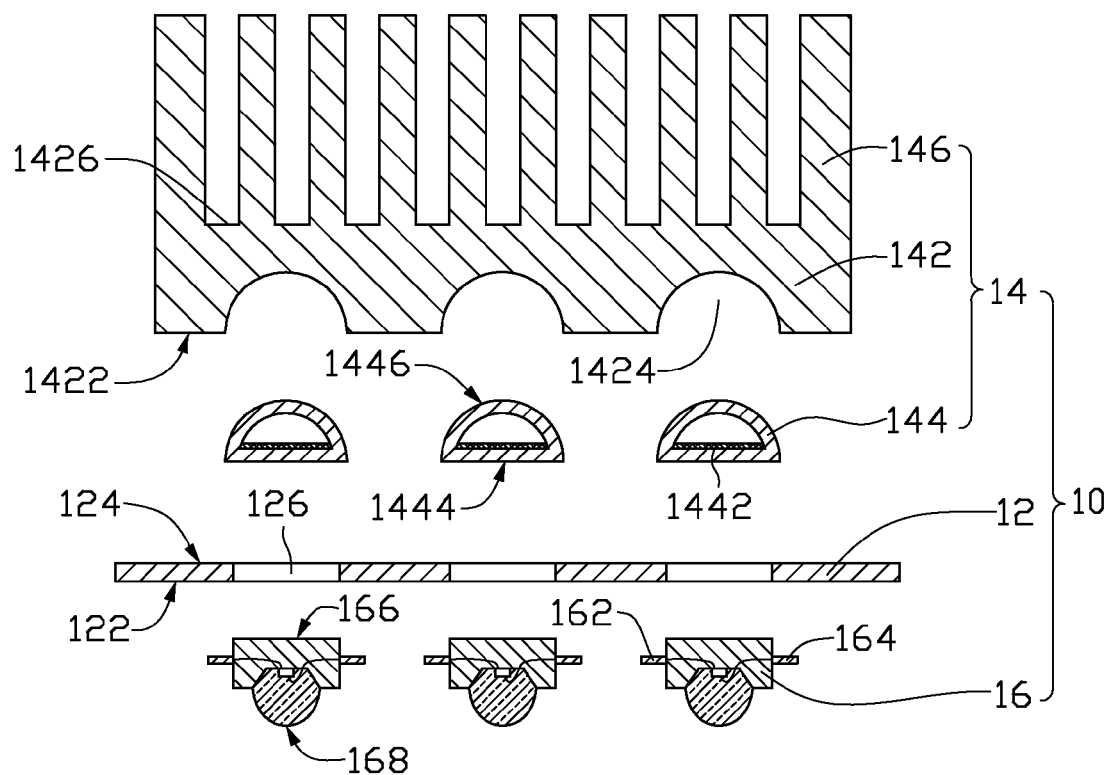
FIG. 1 is a schematic, exploded, cross-sectional view of a light source module, in accordance with a present embodiment.
Figure 2:
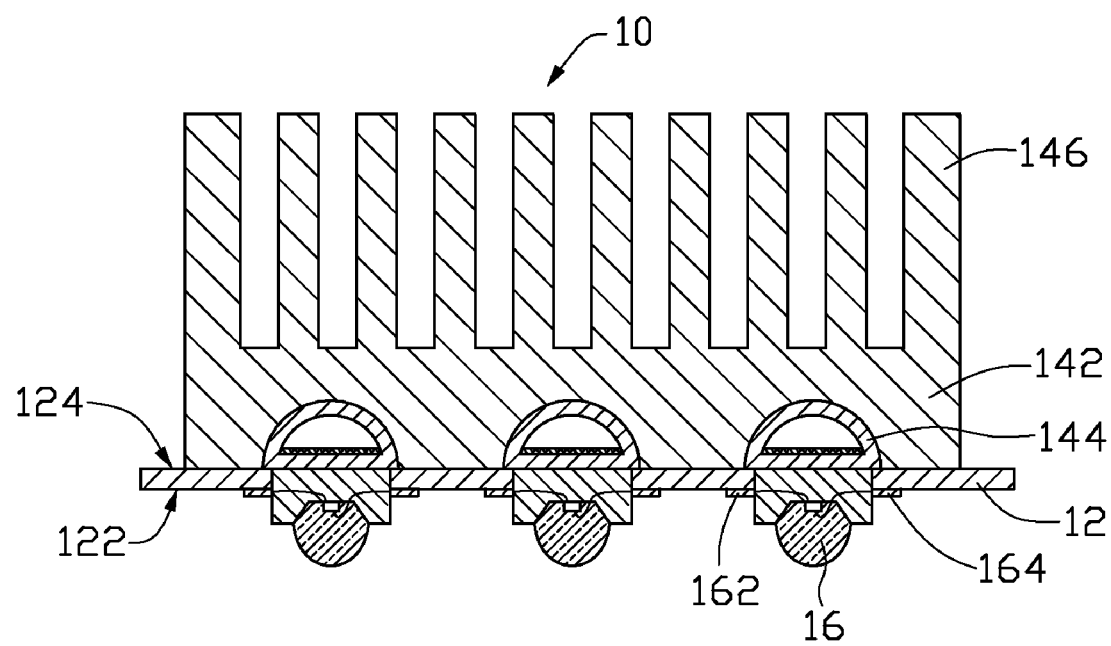
FIG. 2 is an assembled, cross-sectional view of the light source module of FIG. 1.
Figure 3:
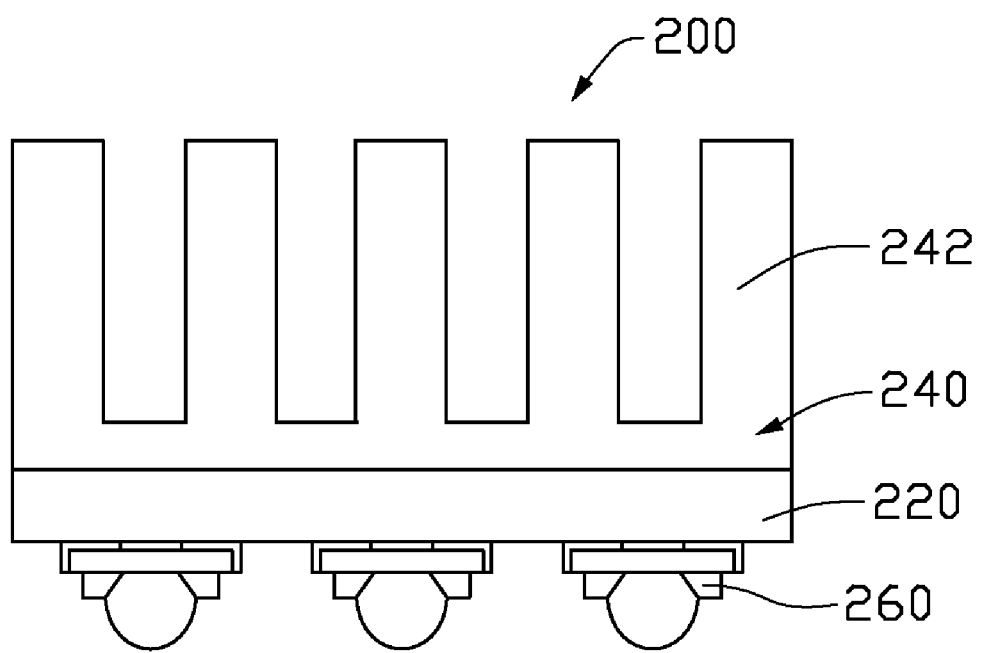
FIG. 3 is a schematic, side view of a typical light source module, in accordance with the related art.

Referring to FIGS. 1 and 2, a light source module 10, in accordance with a present embodiment, is provided. The light source module 10 includes a printed circuit board 12, a heat-dissipating assembly 14, and a number of light emitting elements 16.

The printed circuit board 12 includes a first surface 122, a second surface 124 opposite to the first surface 122, and a number of through holes 126 penetrating/extending through the first and the second surfaces 122, 124. The first surface 122 generally is formed with a number of pads (not shown) thereon for facilitating the electrical connection with the light emitting elements 16. Generally, the number of the through holes 126 corresponds with the number of the light emitting elements 16. The printed circuit board 12 rather suitably is a glass-fiber board, a ceramic board, or a metal core printed circuit board (MCPCB).

The heat-dissipating assembly 14 is, usefully, located immediately adjacent to the second surface 124 to facilitate direct conduction of heat therebetween. The heat-dissipating assembly 14 includes a base 142, a number of heat-conducting elements 144, and, optionally, a number of heat dissipation fins 146.

The base 142 includes a third surface 1422 and a fourth surface 1426 opposite to each other. The third surface 1422 is located adjacent to the second surface 124 of the printed circuit board 12. The third surface 1422 defines a number of cavities 1424 therein. In the illustrated embodiment, the cavities 1424 each are, but not limited to be, arc-shaped. The shape of such cavities 1424, however, is advantageously chosen so as to facilitate a high degree of surface contact between the third surface 1422 and a given heat-conducting element 144. The base 142 generally is made from a material with a high heat conductivity, such as aluminum (Al), copper (Cu), or an alloy thereof.

The heat-conducting elements 144 each are hollow and, usefully, are fluid-filled. The fluid (e.g., liquid or gas) contained in such heat-conducting elements 144 is beneficially chosen to promote the heat-conducting capability of the heat-conducting elements 144. The heat-conducting elements 144 are respectively inlaid in a corresponding cavity 1424 defined in the third surface 1422 and thereby are thermally contacted with the base 142. The heat-conducting elements 144 are also respectively thermally contacted with a corresponding light emitting element 16. A surface of each of the heat-conducting elements 144 that thermally contacts with the base 142 is defined as a heat extraction surface 1446. Another surface of each of the heat-conducting elements 144 that thermally contacts with the corresponding light emitting element 16 is defined as a heat entry surface 1444. The heat extraction surface 1446 has an area that is larger than that of the heat entry surface 1444, rendering achievable a high heat dissipation efficiency for the light source module 10. In the illustrated embodiment, as shown in FIGS. 1 and 2, the heat extraction surface 1446 is arc-shaped (i.e., arcuate) and directly contacts with the arc-shaped peripheral wall of a corresponding cavity 1424. The heat entry surface 1444 is a planar surface and directly contacts a corresponding light emitting element 16. The heat entry surface 1444 is also substantially coplanar with the third surface 1422 of the base 142. It is understood that the heat entry surface 1444 may, instead, be higher (i.e., located in plane not contained within the base 142) than the third surface 1422, so long as such heat entry surface 1444 thermally contacts a corresponding light emitting element 16.

Each heat-conducting elements 144, rather suitably, defines a heat pipe and/or a vapor chamber. In addition, in order to further reduce a thermal contact resistance between each of the heat-conducting elements 144 and the base 142, a thermal interface material, such as a silver paste, is suitably interposed therebetween. Opportunely, in order to further improve a heat conduction efficiency of the heat-conducting elements 144 (in addition or alternatively to employing a thermal interface material), a wick structure 1442 can be formed in an internal sidewall of each of the heat-conducting elements 144, near the heat entry surface 1444.

The heat dissipation fins 146 extend from the fourth surface 1426 and along a direction directed away from the third surface 1422 (advantageously, essentially orthogonal thereto). The configuration of the heat dissipation fins 146 would increase a heat-dissipating area of the base 142 and thereby make it possible for the heat-dissipating assembly 14 to achieve a high heat-dissipation efficiency. The heat dissipation fins 166 generally are made from a material with a high heat conductivity, such as aluminum (Al), copper (Cu), or an alloy thereof. The heat dissipation fins 166 are beneficially integral with the base 142 and thereby promote effective heat conduction away from the base 142.

Each of the light emitting elements 16 is respectively inlaid in a corresponding through hole 126 of the printed circuit board 12. The light emitting elements 16 each define a bottom surface 166 and a light emitting surface 168 opposite to the bottom surface 166.

The bottom surfaces 166 each directly thermally contact with a respective heat-conducting element 144, and a distance between the bottom surface 166 and the first electrode 162 (or the second electrode 164) is, rather usefully, particularly designed/chosen so as to be substantially equal to a thickness of the printed circuit board 12. It is understood that, in order to further reduce a thermal contact resistance between the bottom surface 166 and the heat entry surface 1442, a heat conductive material, such as a thermal grease or paste (e.g., a silver paste), can suitably be sandwiched therebetween. In addition, the light emitting elements 16 also could thermally contact with the heat-conducting elements 144 via metallurgical welding or soldering.

The light emitting surface 168 is suitably located outside of the corresponding through hole 126 and is configured for facilitating the improved utilization efficiency of light emitted from the light emitting elements 16. The light emitting elements 16 each are equipped with a first electrode 162 and a second electrode 164 paired with the first electrode 162. The light emitting elements 16 are electrically connected with the printed circuit board 12 via the respective paired first and second electrodes 162, 164. The paired first and second electrodes 162, 164 are soldered with the corresponding pads formed on the first surface 122 of the printed circuit board 12.

Each of the light emitting element 16 is a point light source. The light emitting elements 16 have a certain number thereof required in practical applications, but that number is not limited to three, as shown FIGS. 1 and 2. In the illustrated embodiment, the light emitting elements 16 are surface mounted device type (SMD-type) light emitting diode (LED) lamps. An SMD-type LED lamp generally includes a substrate (e.g., a metal core printed circuit board), at least a LED chip mounted on the substrate, and an encapsulant for sealing the at least one LED chip from contamination. The first electrode 162 and the second electrode 164 associated therewith are electrically connected with the at least one LED chip. The first electrode 162 and the second electrode 164 extend along a direction substantially parallel to the bottom surface 166 of the SMD-type LED lamp and away from each other. It is understood that the light emitting elements 16 are not limited to SMD-type LED lamps and that other suitable types of LED lamps also are employable. Furthermore, the SMD-type LED lamps could be white LED lamps or other colored LED lamps required in practical applications.

In sum, in one aspect, heat generated from the light emitting elements 16 in operation can be directly transmitted to the heat-dissipating assembly due the configuration of the through holes. Such through holes could help effectively to avoid the occurrence of the conventional phenomenon of heat accumulation. In another aspect, the heat-conducting elements 144 each could achieve a larger heat extraction area with respect to a heat entry area thereof, resulting from the heat-conducting elements 144 being inlaid in the cavities 1424 defined in the base 142. By having a larger heat extraction area, a relatively higher heat-dissipation efficiency of the light source module 10 can likely be achieved.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the present invention.

What is claimed is:

1. A light source module, comprising:
   a printed circuit board including a first surface, a second surface opposite to the first surface, and a plurality of through holes penetrating through the first surface and the second surface;
   a heat-dissipating assembly located adjacent to the second surface of the printed circuit board, the heat-dissipating assembly including a base, a plurality of heat-conducting elements, and a plurality of heat dissipation fins, the base defining a third surface and an opposite fourth surface, the third surface defining a plurality of cavities therein, the heat dissipation fins extending from the fourth surface and along a direction away from the third surface, each of the heat-conducting elements being inlaid in a corresponding cavity defined in the third surface, each of the heat-conducting elements thermally contacting with the base; and
   a plurality of light emitting elements each being placed in a corresponding through holes of the printed circuit board and being thermally contacted with a corresponding heat-conducting elements, each of the light emitting elements being electrically connected with the printed circuit board, each of the light emitting elements defining a light emitting surface located outside the corresponding through hole and being directed away from the second surface of the printed circuit board.

2. The light source module of claim 1, wherein a surface of each of the heat-conducting elements that thermally contacted with the base is defined as a heat extraction surface, another surface of each of the heat-conducting elements that thermally contacted with a corresponding light emitting element is defined as a heat entry surface, and the heat extraction surface has an area larger than that of the heat entry surface.

3. The light source module of claim 2, wherein each of the heat extraction surfaces is arc-shaped.

4. The light source module of claim 2, wherein the heat extraction surface of each of the heat-conducting elements directly contacts with peripheral walls of a corresponding cavity.

5. The light source module of claim 2, wherein each of the heat-conducting elements thermally contacts with the base via a heat conductive material sandwiched between the heat extraction surface thereof and the peripheral walls of a corresponding cavity.

6. The light source module of claim 2, wherein the heat entry surface directly contacts a corresponding light emitting element.

7. The light source module of claim 2, wherein each of the heat-conducting elements thermally contacts a corresponding light emitting element via a thermal interface material interposed between the heat entry surface thereof and the corresponding light emitting element.

8. The light source module of claim 2, wherein each of the heat-conducting elements thermally contacts a corresponding light emitting element by metallurgically welding the heat entry surface thereof to a corresponding light emitting element.

9. The light source module of claim 2, wherein each of the heat-conducting elements is a hollow structure and is equipped with a wick structure formed in an internal sidewall near the heat entry surface thereof.

10. The light source module of claim 9, wherein each of the heat-conducting elements is at least one of a heat pipe and a vapor chamber.

11. The light source module of claim 2, wherein each of the light emitting elements is a point light source.

12. The light source module of claim 11, wherein the point light source is a light emitting diode lamp.

13. The light source module of claim 12, wherein the light emitting diode lamp is an SMD-type light emitting diode lamp, the SMD-type light emitting diode lamp further comprises a bottom surface opposite to the light emitting surface thereof, the bottom surface thermally contacts the heat entry surface of a corresponding heat-conducting element, and the first electrode and the second electrode thereof respectively extend along a direction substantially parallel to the bottom surface and away from each other.

14. The light source module of claim 13, wherein a distance between the bottom surface and the first electrode or the second electrode is substantially equal to a thickness of the printed circuit board along a direction oriented from the first surface thereof to the second surface thereof.

15. The light source module of claim 2, wherein the heat entry surface of each of the heat-conducting elements is located in a corresponding through hole of the printed circuit board.

16. The light source module of claim 2, wherein the heat entry surface of each of the heat-conducting element is substantially coplanar with the third surface of the base.

17. The light source module of claim 2, wherein each of the cavities defined in the third surface is arc-shaped.

18. A light source module, comprising:
    a printed circuit board including a first surface, a second surface opposite to the first surface, and a plurality of through holes penetrating through the first surface and the second surface;
    a heat-dissipating assembly located adjacent to the second surface of the printed circuit board, the heat-dissipating assembly including a heat-dissipating member, and a plurality of fluid-filled hollow structures, the heat-dissipating member defining a plurality of cavities therein, each of the fluid-filled hollow structures being inlaid in a corresponding cavity of the heat-dissipating member and having thermal contact therewith; and
    a plurality of point light sources each being placed in a corresponding through holes of the printed circuit board, each point light source thermally contacting a corresponding fluid-filled hollow structure, each of the point light sources being electrically connected with the printed circuit board.

19. The light source module of claim 18, wherein each of the point light sources has a light emitting surface located outside of a corresponding through hole and directed away from the heat-dissipating assembly.

20. The light source module of claim 19, wherein a surface of each of the fluid-filled hollow structures that thermally contacted with the heat-dissipating member is defined as a heat extraction surface, another surface of each of the liquid-filled hollow structures that thermally contacted with a corresponding point light source is defined as a heat entry surface, and the heat extraction surface has an area larger than that of the heat entry surface.

* * * * *